United States Patent
Yoo et al.

(10) Patent No.: US 10,109,595 B2
(45) Date of Patent: Oct. 23, 2018

(54) DOUBLE-SIDED PACKAGE MODULE AND SUBSTRATE STRIP

(71) Applicant: Samsung Electro-Mechanics Co., Ltd., Suwon-si (KR)

(72) Inventors: Do Jae Yoo, Suwon-si (KR); Hee Jung Jung, Suwon-si (KR); Jong In Ryu, Suwon-si (KR); Ki Joo Sim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/267,233

(22) Filed: Sep. 16, 2016

(65) Prior Publication Data

US 2017/0221835 A1 Aug. 3, 2017

(30) Foreign Application Priority Data

Feb. 3, 2016 (KR) ........................ 10-2016-0013504

(51) Int. Cl.
| | |
|---|---|
| *H01L 23/552* | (2006.01) |
| *H01L 23/498* | (2006.01) |
| *H01L 23/31* | (2006.01) |
| *H01L 25/065* | (2006.01) |
| *H01L 25/18* | (2006.01) |
| *H01L 21/48* | (2006.01) |
| *H01L 21/56* | (2006.01) |

(52) U.S. Cl.
CPC .......... *H01L 23/552* (2013.01); *H01L 21/486* (2013.01); *H01L 21/4817* (2013.01); *H01L 21/561* (2013.01); *H01L 23/3121* (2013.01); *H01L 23/3135* (2013.01); *H01L 23/49805* (2013.01); *H01L 23/49827* (2013.01); *H01L 25/0652* (2013.01); *H01L 25/18* (2013.01); *H01L 2225/06548* (2013.01); *H01L 2225/06572* (2013.01)

(58) Field of Classification Search
CPC ............. H01L 21/41817; H01L 21/486; H01L 21/561; H01L 23/552; H01L 23/3121; H01L 23/3135; H01L 23/49805; H01L 23/49827; H01L 25/0652; H01L 25/18
See application file for complete search history.

(56) References Cited

U.S. PATENT DOCUMENTS

| | | | |
|---|---|---|---|
| 5,880,403 A | * | 3/1999 | Czajkowski .......... H01L 23/055 174/387 |
| 7,342,303 B1 | | 3/2008 | Berry et al. |

(Continued)

FOREIGN PATENT DOCUMENTS

| | | |
|---|---|---|
| CN | 100472780 C | 3/2009 |
| CN | 102074552 A | 5/2011 |

(Continued)

*Primary Examiner* — Fazli Erdem
(74) *Attorney, Agent, or Firm* — NSIP Law

(57) ABSTRACT

A double-sided package module includes a substrate, a first sealing member, a second sealing member, and an extension portion. The substrate includes electronic components positioned on a first surface and a second surface of the substrate. The first sealing member and the second sealing member are positioned on the first surface and the second surface, respectively. The extension portion protrudes from a lateral surface of the substrate into a space between the first sealing member and the second sealing member.

19 Claims, 9 Drawing Sheets

A-A

(56) References Cited

U.S. PATENT DOCUMENTS

| | | | |
|---|---|---|---|
| 2002/0050371 A1* | 5/2002 | Czjakowski | G21F 1/08 174/360 |
| 2004/0158978 A1* | 8/2004 | Lee | B29C 70/72 29/841 |
| 2004/0178514 A1* | 9/2004 | Lee | H01L 21/565 257/787 |
| 2006/0267159 A1 | 11/2006 | Yamamoto et al. | |
| 2007/0274059 A1* | 11/2007 | (Chennupati)Raghuram | G06F 1/182 361/818 |
| 2008/0150095 A1 | 6/2008 | Yang et al. | |
| 2008/0174013 A1 | 7/2008 | Yang et al. | |
| 2009/0194852 A1* | 8/2009 | Chiu | H01L 21/6835 257/660 |
| 2010/0013064 A1* | 1/2010 | Hsu | H01L 23/055 257/660 |
| 2010/0032815 A1* | 2/2010 | An | H01L 23/3121 257/660 |
| 2010/0207259 A1* | 8/2010 | Liao | H01L 21/6835 257/660 |
| 2011/0115059 A1* | 5/2011 | Lee | H01L 21/561 257/659 |
| 2011/0298111 A1* | 12/2011 | Kim | H01L 21/561 257/660 |
| 2013/0127025 A1* | 5/2013 | Cho | H01L 23/552 257/660 |
| 2013/0214396 A1* | 8/2013 | Kim | H01L 23/552 257/659 |
| 2014/0217566 A1* | 8/2014 | Goida | H01L 23/04 257/676 |
| 2015/0001690 A1* | 1/2015 | Nam | H01L 23/49833 257/659 |
| 2015/0091152 A1* | 4/2015 | Jo | H01L 23/5385 257/693 |
| 2015/0091177 A1* | 4/2015 | Hong | H05K 3/181 257/773 |
| 2015/0155256 A1* | 6/2015 | Lin | H01L 24/81 257/737 |
| 2016/0035680 A1* | 2/2016 | Wu | H01L 23/552 257/659 |
| 2017/0062360 A1* | 3/2017 | Chang | H01L 23/3121 |
| 2017/0110413 A1* | 4/2017 | Chen | H01L 21/3205 |
| 2017/0141081 A1* | 5/2017 | Lee | H01L 25/0657 |
| 2017/0317038 A1* | 11/2017 | Tsai | H01L 23/60 |

FOREIGN PATENT DOCUMENTS

| | | |
|---|---|---|
| KR | 10-2011-0134168 A | 12/2011 |
| KR | 10-2013-0056570 A | 5/2013 |
| KR | 10-2015-0002264 A | 1/2015 |

* cited by examiner

A-A

F-F

DOUBLE-SIDED PACKAGE MODULE AND SUBSTRATE STRIP

CROSS-REFERENCE TO RELATED APPLICATION(S)

This application claims benefit under 35 USC 119(a) of Korean Patent Application No. 10-2016-0013504 filed on Feb. 3, 2016 in the Korean Intellectual Property Office, the entire disclosure of which is incorporated herein by reference for all purposes.

BACKGROUND

1. Field

The following description relates to a double-sided package module provided with electronic components mounted on two surfaces of a substrate, and a substrate strip therefor.

2. Description of Related Art

Double-sided package modules are used to improve a degree of integration of electronic components. For example, in the case of double-sided package modules, various types of electronic components are mounted on two surfaces of a substrate. Thus, such double-sided package modules may be mounted in a relatively narrow space in electronic devices.

However, such double-sided package modules are provided with electronic components mounted on both surfaces of multiple substrates. Thus, a formation method and process to form or to manufacture a shielding layer to shield electromagnetic waves are difficult and complex. Thus, the development of double-sided package modules allowing for the easy formation of shielding layers while increasing a shielding ratio is required.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, a double-sided package module is described having a relatively high shielding ratio.

In accordance with an embodiment, there may be provided a double-sided package module, including: a substrate including electronic components positioned on a first surface and a second surface of the substrate; a first sealing member and a second sealing member positioned on the first surface and the second surface, respectively; and an extension portion protruding from a lateral surface of the substrate into a space between the first sealing member and the second sealing member.

The double-sided package module may further include: a first shielding layer positioned on an upper surface and a lateral surface of the first sealing member.

The double-sided package module may further include: a second shielding layer positioned on a lateral surface of the second sealing member.

The extension portion may include a first curved surface connected to a lateral surface of the first sealing member.

The extension portion may include a second curved surface connected to a lateral surface of the second sealing member.

The extension portion may include a conductive member connected to shielding layers of the first sealing member and the second sealing member.

The conductive member may be continuously formed along a circumference of the substrate.

The conductive member may be continuously formed in a thickness direction of the substrate.

The conductive member may be formed of linear lines or oblique lines extended from an end of the extension portion toward the substrate.

The double-sided package module may further include: a via electrode extended from the substrate to a lower surface of the second sealing member.

In accordance with a further embodiment, there is provided a substrate strip, including: a substrate; a conductive member positioned on the substrate and configured to divide the substrate into unit regions; and electronic components positioned in a space divided by the conductive member.

The conductive member may include a first pattern having a quadrangular shape.

The conductive member may include a second pattern extended from the first pattern.

In accordance with a further embodiment, there is provided a double-sided package module, including: a substrate including an upper surface and a lower surface, wherein electronic components are positioned on at least one of the upper surface and the lower surface, printed circuits positioned within or on the surface of the substrate and configured to connect the electronic components, an extension portion, formed between the upper and the lower surfaces, including a first curved surface formed on a side of the upper surface and a second curved surface formed on a side of the lower surface, and a conductive member continuously formed along a circumference of the extension portion.

The double-sided package module may further include: a first sealing member formed on the upper surface of the substrate; and a second sealing member formed on the lower surface of the substrate.

The first and the second sealing members may cover external surfaces of the electronic components.

The double-sided package module may further include: a first shielding layer formed on an upper surface and a lateral surface of the first sealing member; and a second shielding layer formed on a lateral surface of the second sealing member.

The extension portion protrudes from a lateral surface of the substrate to connect to the first and the second shielding layers and connects to lateral surfaces of the first and the second sealing members.

The conductive member may include a first pattern having a quadrangular shape surrounding the electronic components in unit regions, and a second pattern having a linear shape extended from the first pattern in a single direction.

The conductive member may be exposed to an external surface of the substrate, and has a form in which oblique lines are repeated in a symmetrical manner.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
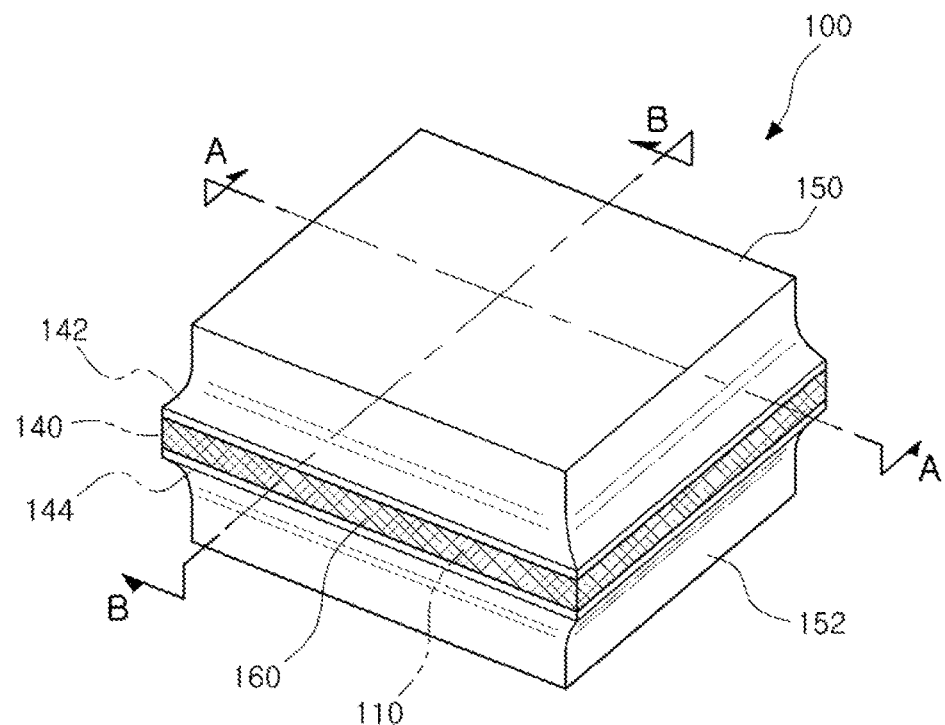
FIG. 1 is a perspective view of a double-sided package module, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 illustrates a schematic configuration of a double-sided package module, according to an embodiment.

A double-sided package module 100, according to an embodiment, includes shielding layers 150 and 152 configured to block electromagnetic waves. For example, a first shielding layer 150 and a second shielding layer 152 are formed on upper and lower portions of the double-sided package module 100, respectively.

The double-sided package module 100 includes a conductive member 160 electrically connected to the first and second shielding layers 150 and 152. For example, the conductive member 160, which is connected to the first shielding layer 150 and the second shielding layer 152, is formed on the substrate 110 of the double-sided package module 100.

Figure 2:
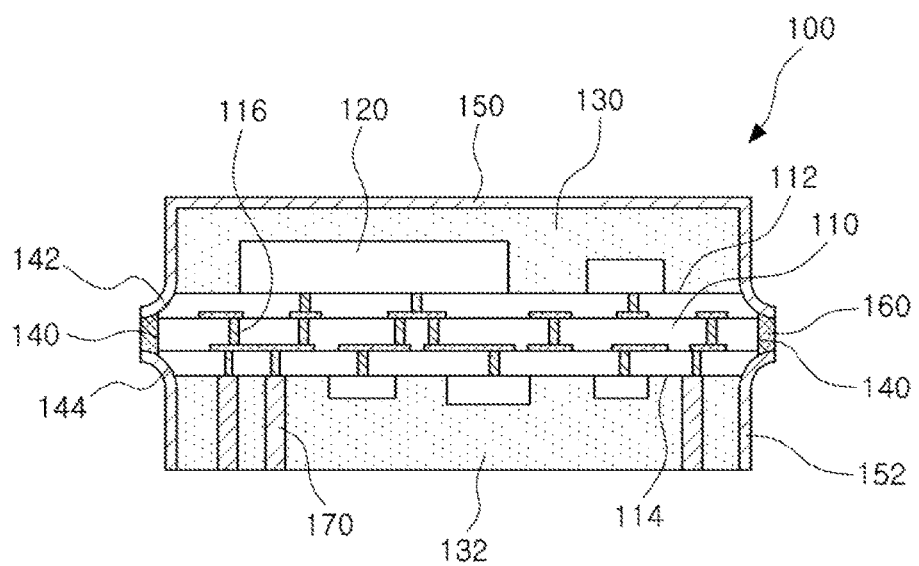
FIG. 2 is a cross sectional view of the double-sided package module taken along line A-A of FIG. 1.
Figure 3:
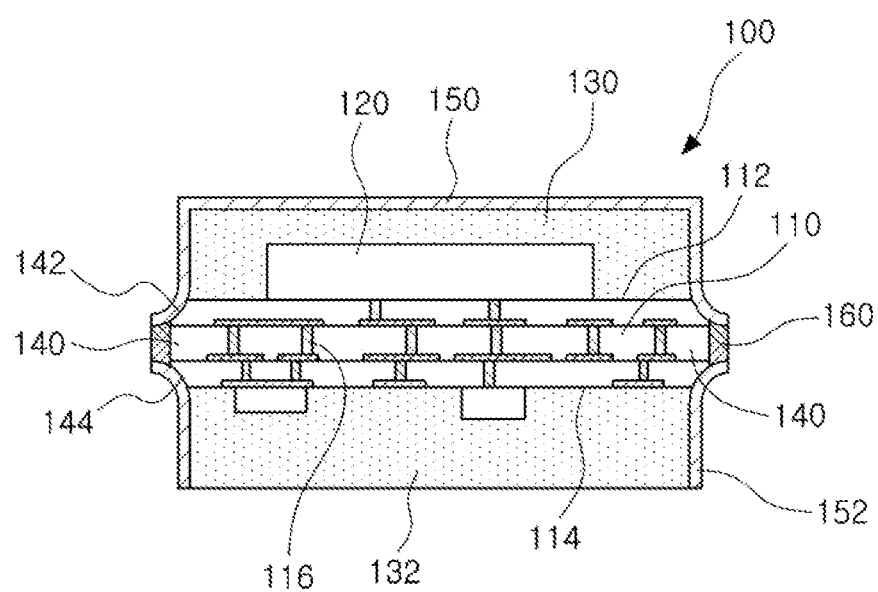
FIG. 3 is a cross sectional view of the double-sided package module taken along line B-B of FIG. 1.

An interior structure of the double-sided package module will be described in detail with reference to FIGS. 2 and 3.

The double-sided package module 100 or a substrate module includes the substrate 110, an electronic component 120, the first and the second sealing members 130 and 132, the first and second shielding layers 150 and 152, and the conductive member 160. However, the configuration of the double-sided package module 100 is not limited thereto. For example, the double-sided package module 100 may further include a via electrode 170 connected to a printed circuit 116 of the substrate 110. In addition, the double-sided package module 100 may further include a solder ball (not shown) connected to the via electrode 170.

The substrate 110 has a multilayer structure. For example, the substrate 110 is formed in a form in which a core layer, a metal layer, a resin layer, and other layers are sequentially combined with each other. However, the configuration of the substrate 110 is not limited thereto. For example, the substrate 110 includes a single layer structure.

The substrate 110 includes the printed circuit 116 configured to connect electronic components 120 to each other. For example, one or more printed circuits 116 connecting the electronic components 120 are formed in an interior or on an exterior of the substrate 110. The printed circuits 116 may be formed through a plating process or a developing process. However, the formation method of the printed circuit 116 is not limited thereto.

The electronic components 120 are formed on a first surface 112 (or an upper surface 112 of the substrate 110) and a second surface 114 (or a lower surface 114 of the substrate 110) of the substrate 110, opposite to the first surface 112. For example, a large sized electronic component 120 is positioned, placed, or located on the first surface 112 of the substrate 110, while a small sized electronic component 120 is positioned on the second surface 114 of the substrate 110. However, the disposition form of the electronic components 120 is not limited thereto. For example, the large sized electronic component 120 may also be positioned on the second surface 114 of the substrate 110. In a further example, a combination of small and large sized electronic components 120 are positioned along the first surface 112 and the second surface 114 of the substrate 110. In another example, the electronic components 120 are not positioned on the second surface 114 of the substrate 110. In an example, examples of the electronic component 120 include an integrated circuit, a passive device, and other types of structural devices, components, circuits, or elements.

The first and the second sealing members 130 and 132 are formed on the substrate 110. For example, the first sealing member 130 is formed on the first surface 112 of the substrate 110, and the second sealing member 132 is formed on the second surface 114 of the substrate 110.

The first and the second sealing members 130 and 132 are formed to protect the electronic components 120 from external factors or sources. In one embodiment, the first and the second sealing members 130 and 132 cover an entirety of external surfaces of the electronic components 120 to protect the electronic components 120 from external interference or to prevent from the electronic components 120 to be in contact or in direct contact with external sources.

The first and the second sealing members 130 and 132 are configured to reduce external impacts applied thereto. For example, the first and the second sealing members 130 and 132 are formed of an epoxy resin or other types of polyurethane elements to facilitate the absorption of external impacts therein. However, a material of the first and the second sealing members 130 and 132 is not limited to a resin-based material.

An extension portion 140 is formed on the substrate 110. The extension portion 140 is formed in a form protruding from a lateral surface of the substrate 110 to facilitate a connection thereof to the shielding layers 150 and 152. For example, the extension portion 140 is formed to be extended further from a circumferential surface of the substrate 110 than the first and the second sealing members 130 and 132.

The extension portion 140 includes a track based on a dicing process to manufacture the double-sided package module 100. For example, curved surfaces 142 and 144 are formed on the extension portion 140. In one embodiment, a first curved surface 142 is formed on a side or an end side surface of the first surface 112 of the substrate 110, and a second curved surface 144 is formed on a side or an end side surface of the second surface 114 of the substrate 110. In another embodiment, the first curved surface 142 is formed on both sides or both end side surfaces of the first surface 112 of the substrate 110, and a second curved surface 144 is formed on both sides or both end side surfaces of the second surface 114 of the substrate 110. The curved surfaces 142 and 144 are connected to lateral surfaces of the first and the second sealing members 130 and 132.

The conductive member 160 electrically connected to the shielding layers 150 and 152 is formed on the extension portion 140. For example, the conductive member 160 is formed on end portions of the extension portion 140. The conductive member 160 is continuously formed along a circumference of the extension portion 140. The conductive member 160 formed as described above improves electrical contact reliability with the shielding layers 150 and 152.

The shielding layers 150 and 152 are formed on the first and the second sealing members 130 and 132. In one configuration, the first shielding layer 150 is formed on an upper surface and a lateral surface of the first sealing member 130, and the second shielding layer 152 is formed on a lateral surface of the second sealing member 132. In another configuration, the first shielding layer 150 is formed on the upper surface and the lateral surface of the first sealing member 130, and the second shielding layer 152 is formed on a lower surface and the lateral surface of the second sealing member 132.

The shielding layers 150 and 152 are formed on the extension portion 140. For example, the first shielding layer 150 is formed on the first curved surface 142 of the extension portion 140, and the second shielding layer 152 is formed on the second curved surface 144 of the extension portion 140. In an example, the shielding layers 150 and 152 are formed using electroplating or electroless plating. However, the formation method of the shielding layers 150 and 152 is not limited thereto. In an embodiment, the shielding layers 150 and 152 completely shield external surfaces of the first and the second sealing members 130 and 132, to reduce an interference phenomenon caused due to detrimental electromagnetic waves.

The double-sided package module 100 configured as above secures electrical contact reliability between the shielding layers 150 and 152 and the conductive member 160, as well as blocking detrimental electromagnetic waves through the shielding layers 150 and 152.

Substrates (the substrate 110) configuring the double-sided package module 100 may be manufactured using a single substrate strip. For example, a plurality of substrates 110 are obtained through a process of dicing a substrate strip.

Next, a substrate strip, a base for the manufacturing of a double-sided package module, will be described with reference to FIGS. 4 and 5.

Figure 4:
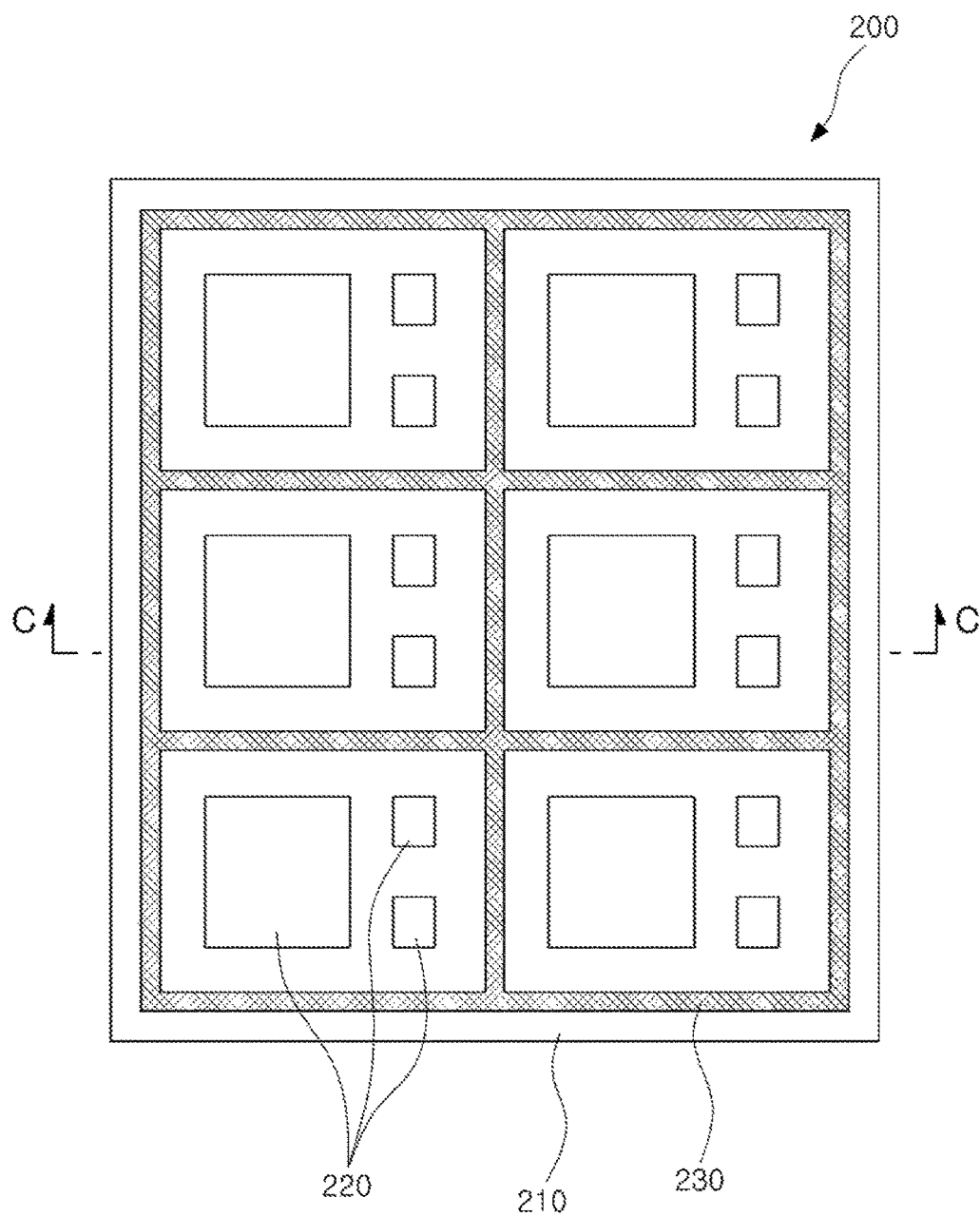
FIG. 4 is a plan view of a substrate strip, according to an embodiment.
Figure 5:
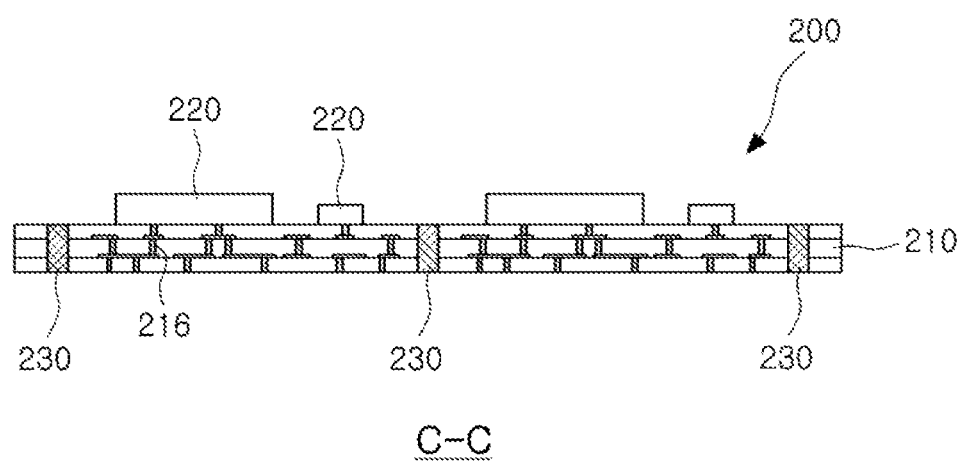
FIG. 5 is a cross sectional view of the substrate strip taken along line C-C of FIG. 4.

FIG. 4 illustrates a substrate module in which a substrate strip 200 includes a substrate 210, electronic components 220, and a conductive member 230. However, the configuration of the substrate strip 200 is not limited to the structural elements described above. For example, the substrate strip 200 may further include a sealing member.

The substrate 210 longitudinally extends in a single direction. For example, the substrate 210 may have a form in which unit substrates are continuously provided in length and width directions thereof. The substrate 210 includes a plurality of layers, which are laminated. For example, the substrate 210 includes a core layer, a metal layer, and a resin layer, which are laminated in a predetermined order.

The substrate 210 includes printed circuits 216 (FIG. 5) connecting the electronic components 220. For example, the printed circuits 216 electrically connecting different types of electronic components 220 to each other are positioned within or on a surface of the substrate 210.

The electronic components 220 are positioned on the substrate 210. For example, the electronic components 220 are positioned on a first surface of the substrate 210. However, the disposition of the electronic components 220 is not limited to the first surface of the substrate 210. For example, the electronic components 220 may be positioned on the first surface and a second surface of the substrate 210, respectively.

The electronic components 220 are positioned with a predetermined interval therebetween. For example, the same type of electronic components 220 are positioned with the same spacing therebetween in a length or width direction of the substrate 210.

The conductive member 230 is formed on and through the substrate 210. For example, the conductive member 230 is formed in length and width directions of the substrate 210. The conductive member 230 is formed to divide the substrate 210 into two or more unit regions. For example, regions of the substrate 210 divided by the conductive member 230 may be respective single, unit substrates. Thus, the same number of electronic components 220 may be positioned in the regions of the substrate divided by the conductive member 230.

The conductive member 230 is formed to extend through the substrate 210. In one example, the conductive member 230 extends from the first surface 112, through the substrate 210, to the second surface 114. The conductive member 230 extends in a thickness direction of the substrate 210 as illustrated in FIG. 5. Thus, the conductive member 230 is provided to divide the substrate 210 into a plurality of cross-sectional regions.

The conductive member 230 is formed to have a predetermined width. For example, a width of the conductive member 230 is greater than a thickness of a cutting blade cutting the substrate strip 200. Thus, in the case of the substrate strip 200, according to the embodiment, when the substrate 210 is cut, based on the conductive member 230, the conductive member 230 is exposed to an external surface of the substrate 210 to improve electrical contact reliability thereof with the shielding layers.

Next, another embodiment of the substrate strip will be described.

Figure 6:
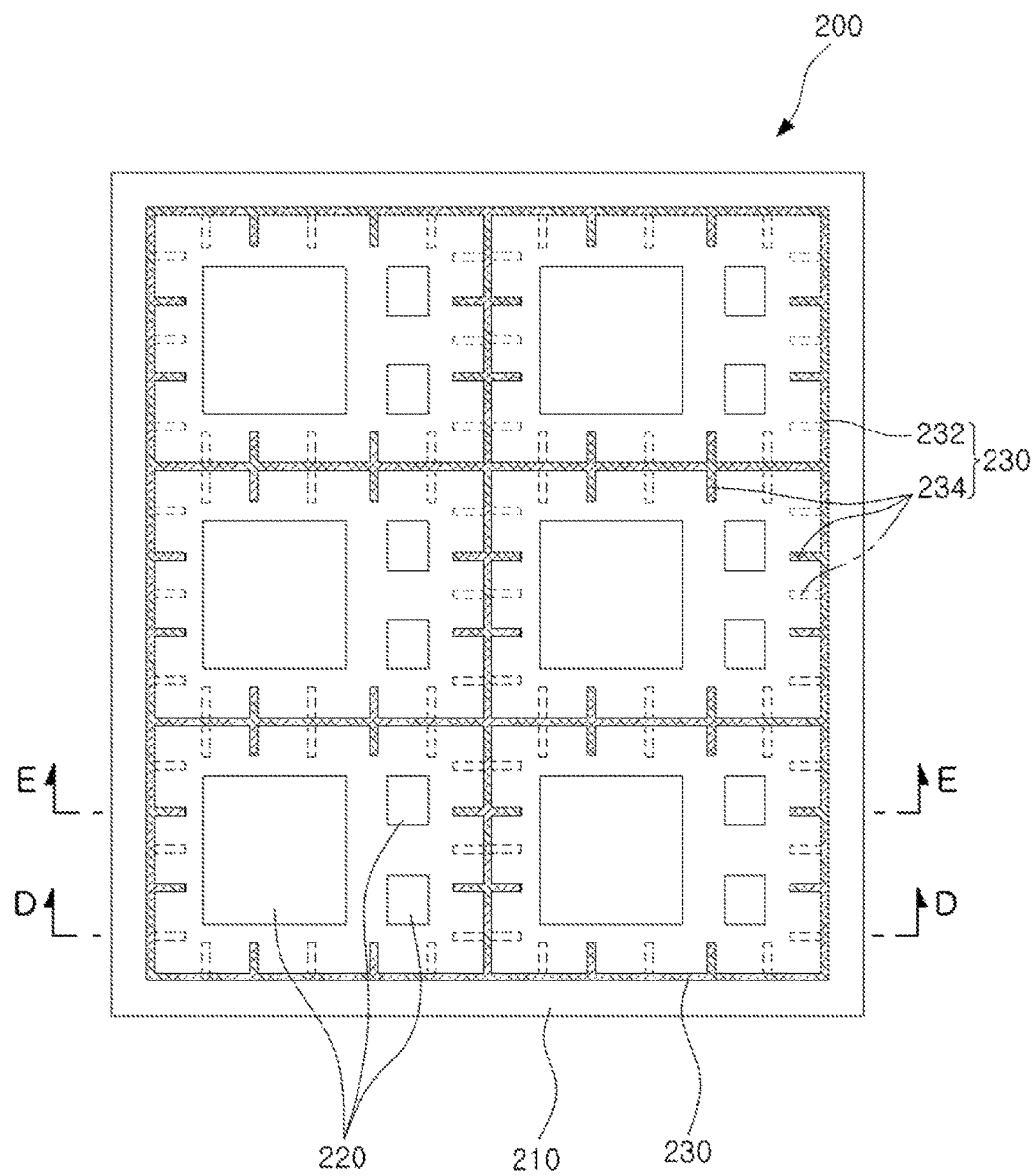
FIG. 6 is a plan view of a substrate strip, according to another embodiment.
Figure 7:
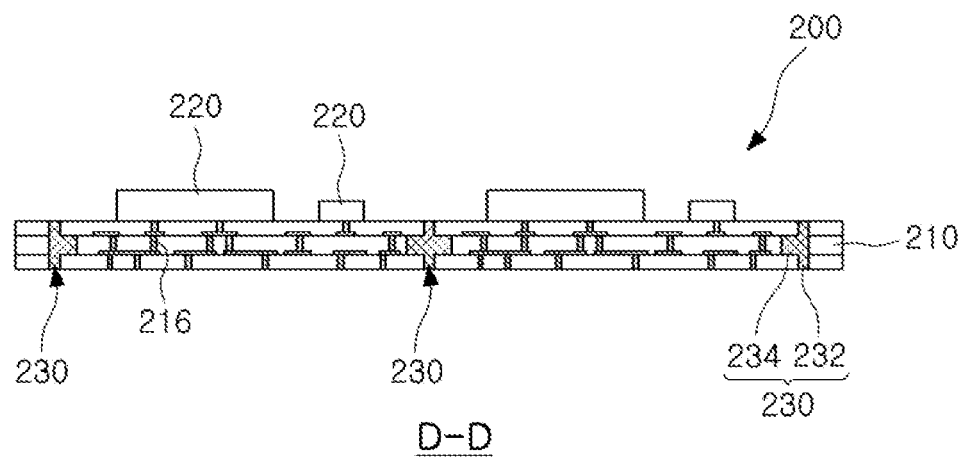
FIG. 7 is a cross sectional view of the substrate strip taken along line D-D of FIG. 6.
Figure 8:
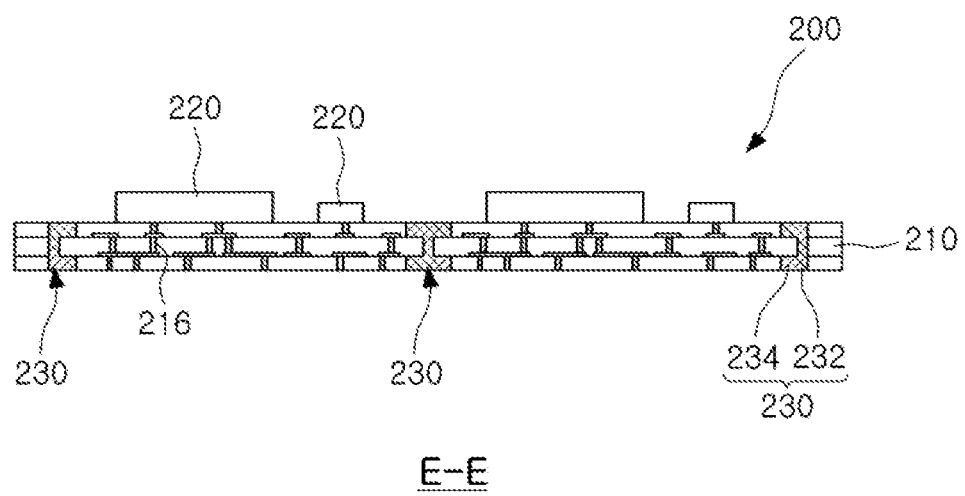
FIG. 8 is a cross sectional view of the substrate strip taken along line E-E of FIG. 6.

First, a substrate strip according to another embodiment will be described with reference to FIGS. 6 to 8.

A substrate strip 200, according to an embodiment, is differentiated from the substrate strip in the aforementioned embodiment in terms of a shape of a conductive member 230. For example, in the embodiment, the conductive member 230 includes a first pattern 232 and a second pattern 234. The first pattern 232 has a quadrangular shape surrounding the electronic components 220 in unit regions, and the second pattern 234 has a linear shape extended from the first pattern 232 in a single direction. The second patterns 234 have forms deviating from each other in respective layers of the substrate 210, as illustrated in FIGS. 7 and 8. In one embodiment, at a middle position of the substrate strip 200, the conductive member 230 has a middle portion wider than a top and a bottom portions thereof. Even in a case in which a cutting position of the substrate deviates from a position of the first pattern 232, the conductive member 230 formed as above may be exposed to an external surface of the substrate 210 to allow the second pattern 234 to electrically contact the shielding layers.

Figure 9:
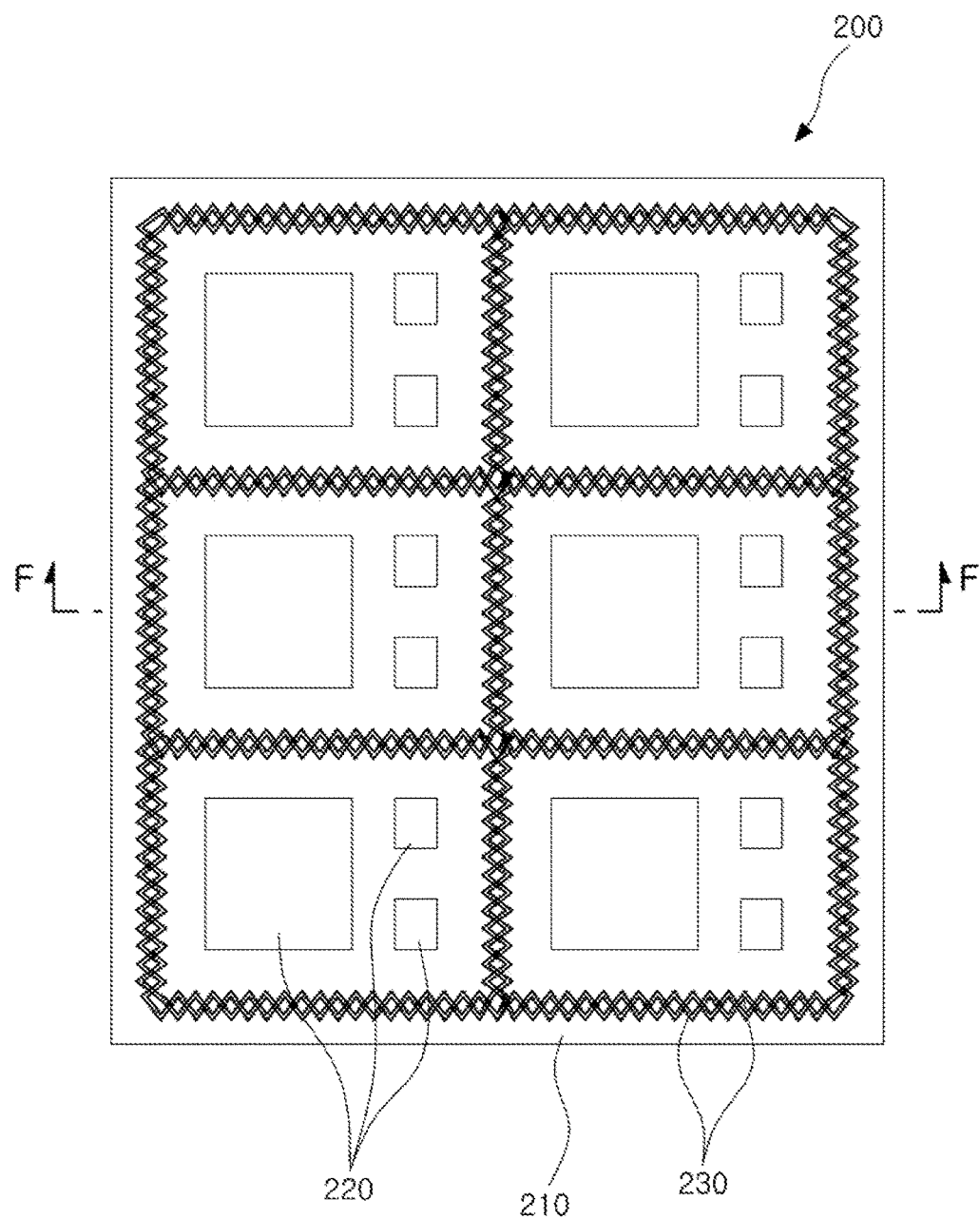
FIG. 9 is a plan view of a substrate strip, according to another embodiment.
Figure 10:
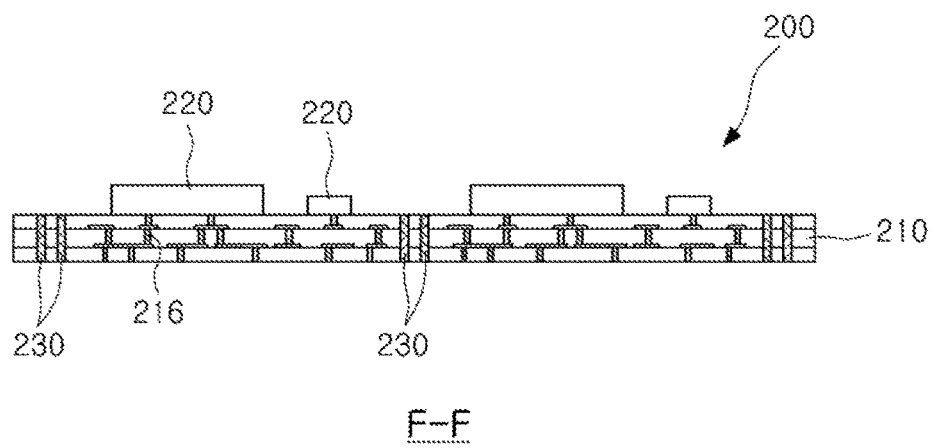
FIG. 10 is a cross sectional view of the substrate strip taken along line F-F of FIG. 9.

A substrate strip according to another embodiment will be described with reference to FIGS. 9 to 10.

The substrate strip 200, according to the embodiment, is differentiated from the substrate strip in the aforementioned embodiment in terms of a shape of the conductive member 230. For example, the conductive member 230 has a form in which a plurality of oblique lines are repeated in a symmetrical manner.

Figure 11:
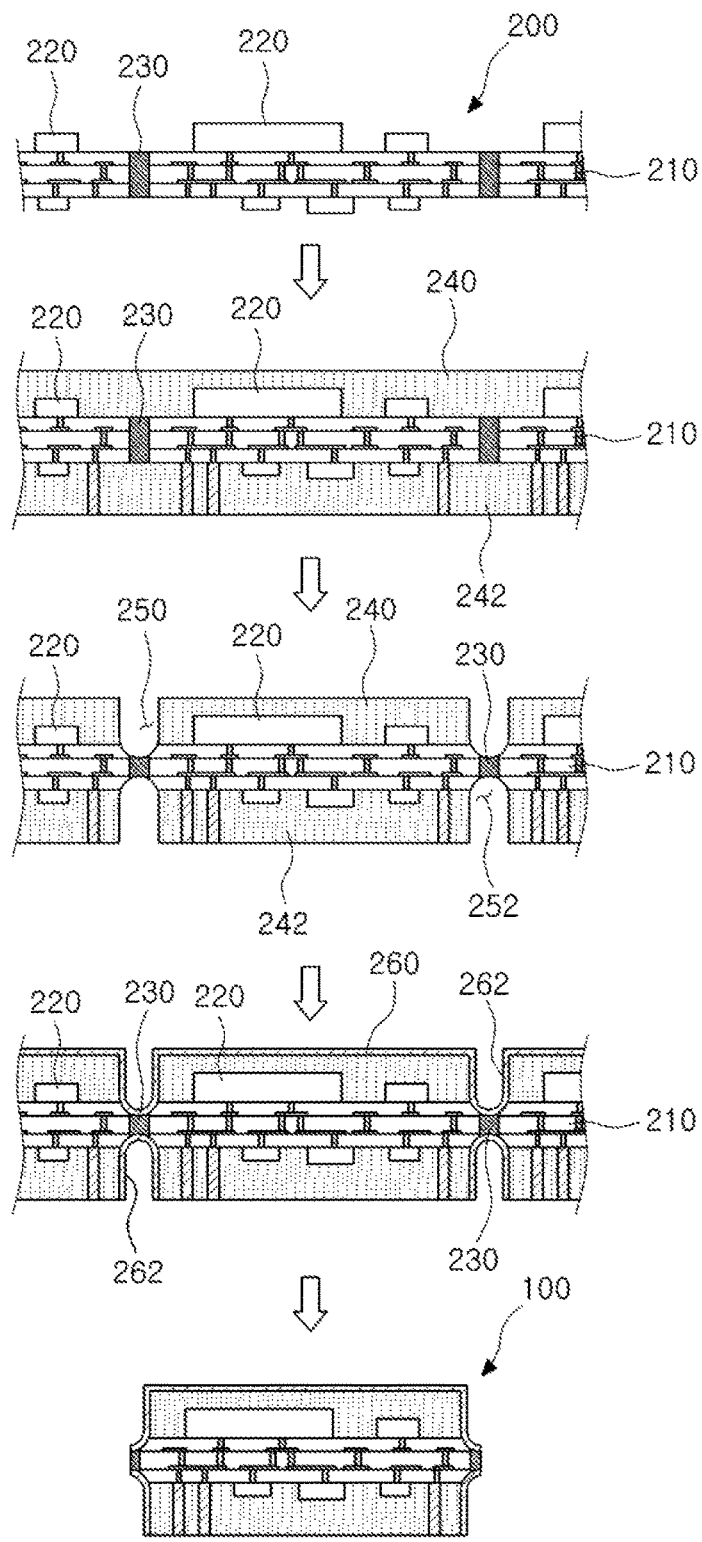
FIG. 11 is a process diagram illustrating a method of manufacturing a double-sided package module, according to an embodiment.

A method of manufacturing a double-sided package module will be described with reference to FIG. 11.

The method of manufacturing a double-sided package module includes forming a conductive member 230, forming sealing members 240 and 242, forming cutting grooves 250 and 252, forming shielding layers 260 and 262, and performing a dicing process.

1) Formation of Conductive Member 230

An operation of forming a conductive member 230 includes a series of processes to form the conductive member 230 in a substrate. For example, the operation includes preparing a substrate strip 200, forming a groove in a substrate 210, and forming the conductive member 230 in the groove. The conductive member 230 may be formed through a method of electroplating, electroless plating, or charging of a conductive material. However, the formation of the conductive member 230 is not limited thereto.

The operation of forming the conductive member 230 further includes forming a printed circuit 216 in the substrate 210. The formation of the printed circuit 216 may be performed together with the process of forming the conductive member 230.

The operation of forming the conductive member 230 includes disposing an electronic component 220 on the substrate 210. However, the process of disposing the electronic component 220 may be performed before or after the operation of forming the conductive member 230.

2) Formation of Sealing Member 240

An operation of forming a sealing member 240 includes a process of forming a sealing member on one or two surfaces of a substrate. The operation of forming the sealing member 240 may be divided into processes of forming a first sealing member 240 on a first surface of the substrate 210 and forming a second sealing member 242 on a second surface of the substrate 210. However, the operation of forming the sealing member 240 is not limited to the two processes described above. For example, the sealing members 240 and 242 may be simultaneously formed on two surfaces of the substrate 210.

3) Formation of Cutting Grooves 250 and 252

An operation of forming cutting grooves 250 and 252 is a preparatory operation of dividing a substrate 210 into unit sized regions, and includes a process of forming the cutting grooves 250 and 252 on a first surface and a second surface, respectively, of the substrate 210. For example, a first groove 250 and a second groove 252 are formed independently of each other through separate processes. In an alternative example, the first groove 250 and the second groove 252 are simultaneously formed through a same process. The cutting grooves 250 and 252 may be formed to have a depth allowing the conductive member 230 of the substrate 210 to be exposed. The cutting grooves 250 and 252 may be formed through mechanical cutting or chemical polishing (etching). In an example, ends of the cutting grooves 250 and 252 formed using the former method may have a curved form, while ends of the cutting grooves 250 and 252 formed using the latter method may have a pointed form.

4) Forming of Shielding Layers 260 and 262

An operation of forming shielding layers 260 and 262 includes a process of forming the shielding layers 260 and 262 on the sealing member 240 and in the cutting grooves 250 and 252. For example, a first shielding layer 260 is formed on an upper surface of the first sealing member 240 and in the first groove 250, and the second shielding layer 262 is formed in the second groove 252.

The shielding layers 260 and 262 may be formed using electroplating or electroless plating. However, the formation method of the shielding layers 260 and 262 is not limited thereto.

For example, when the shielding layer 262 is formed on a lower surface of the second sealing member 242, a connection electrode of the double-sided package module 100 may not be formed. Thus, a process of taping a lower surface of the second sealing member 242 may be performed before performing the formation of the connection electrode. Alternatively, after the operation is performed, an operation of removing the shielding layer 262 having been formed on a lower surface of the second sealing member 242 may be further performed by polishing the lower surface of the second sealing member 242.

5) Dicing

A dicing operation includes a process of completely cutting the substrate 210 divided, based on the cutting grooves 250 and 252 serving as boundaries. After the dicing operation is performed, the double-sided package module 100 having a form illustrated in FIG. 11 is completed.

Because in the method of manufacturing a double-sided package module as previously described, the disposition of electronic components, the formation of sealing members, and the formation of shielding layers are performed at a level of the substrate strip 200, a double-sided package module manufacturing process may be simplified. In addition, because the double-sided package module manufacturing method secures reliability of contact between a conductive member of a substrate and a shielding layer, a double-sided package module manufacturing shield is improved.

As set forth above, according to embodiments, a shielding ratio of a double-sided package module is improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A double-sided package module, comprising:
    a substrate comprising electronic components positioned on a first surface and a second surface of the substrate;
    a first sealing member and a second sealing member positioned on the first surface and the second surface, respectively;
    an extension portion protruding from a lateral surface of the substrate into a space between the first sealing member and the second sealing member so as to be positioned between the first sealing member and the second sealing member;
    a first shielding layer disposed on an upper surface and a lateral surface of the first sealing member; and
    a second shielding layer positioned on a lateral surface of the second sealing member,
    wherein the extension portion comprises a conductive member connected to the fist shielding layer on the first sealing member and the second shielding layer on the second sealing member.

2. The double-sided package module of claim 1, wherein the extension portion comprises a first curved surface connected to a lateral surface of the first sealing member.

3. The double-sided package module of claim 1, wherein the extension portion comprises a second curved surface connected to a lateral surface of the second sealing member.

4. The double-sided package module of claim 1, wherein the conductive member is continuously formed along a circumference of the substrate.

5. The double-sided package module of claim 1, wherein the conductive member is continuously formed in a thickness direction of the substrate.

6. The double-sided package module of claim 1, wherein the conductive member is formed of linear lines or oblique lines extended from an end of the extension portion toward the substrate.

7. The double-sided package module of claim 1, further comprising:
    a via electrode extended from the substrate to a lower surface of the second sealing member.

8. The double-sided package module of claim 1, wherein the extension portion comprises a linear segment extending between two curved surfaces.

9. A substrate strip, comprising:
    a substrate;
    a conductive member positioned on and through the substrate and configured to divide the substrate into unit regions; and
    electronic components positioned in a space divided by the conductive member;
    a first sealing member and a second sealing member positioned on a first surface and a second surface of the substrate, respectively;
    a first shielding layer disposed on an upper surface and a lateral surface of the first sealing member; and
    a second shielding layer positioned on a lateral surface of the second sealing member,
    wherein the conductive member is in electrical contact with the fist shielding layer and the second shielding layer.

10. The substrate strip of claim 9, wherein the first pattern comprises a quadrangular shape.

11. The substrate strip of claim 10, wherein the second pattern comprises a linear shape.

12. The substrate strip of claim 9, wherein the conductive member comprises a first pattern and a second pattern extending orthogonal to the first pattern.

13. A double-sided package module, comprising:
    a substrate comprising an upper surface and a lower surface, wherein electronic components are positioned on at least one of the upper surface and the lower surface, printed circuits positioned within or on the surface of the substrate and configured to connect the electronic components, an extension portion, formed between the upper and the lower surfaces, comprising a first curved surface formed on a side of the upper surface and a second curved surface formed on a side of the lower surface, and a conductive member continuously formed along a circumference of the extension portion.

14. The double-sided package module of claim 13, further comprising:

a first sealing member formed on the upper surface of the substrate; and a second sealing member formed on the lower surface of the substrate.

15. The double-sided package module of claim 14, wherein the first and the second sealing members cover external surfaces of the electronic components.

16. The double-sided package module of claim 14, further comprising:

a first shielding layer formed on an upper surface and a lateral surface of the first sealing member; and a second shielding layer formed on a lateral surface of the second sealing member.

17. The double-sided package module of claim 16, wherein the extension portion protrudes from a lateral surface of the substrate to connect to the first and the second shielding layers and connects to lateral surfaces of the first and the second sealing members.

18. The double-sided package module of claim 13, wherein the conductive member comprises a first pattern having a quadrangular shape surrounding the electronic components in unit regions, and a second pattern having a linear shape extended from the first pattern in a single direction.

19. The double-sided package module of claim 13, wherein the conductive member is exposed to an external surface of the substrate, and has a form in which oblique lines are repeated in a symmetrical manner.

* * * * *